United States Patent
Perroni et al.

(10) Patent No.: US 10,186,317 B2
(45) Date of Patent: *Jan. 22, 2019

(54) PHASE CHANGE MEMORY DEVICE AND METHOD OF OPERATION

(71) Applicant: STMicroelectronics S.r.l., Agrate Brianza (IT)

(72) Inventors: Maurizio Francesco Perroni, Furnari (IT); Carmelo Paolino, Palermo (IT); Salvatore Polizzi, Palermo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/842,347

(22) Filed: Dec. 14, 2017

(65) Prior Publication Data

US 2018/0108405 A1    Apr. 19, 2018

Related U.S. Application Data

(63) Continuation of application No. 15/475,609, filed on Mar. 31, 2017, now Pat. No. 9,865,346.

(30) Foreign Application Priority Data

Aug. 11, 2016 (IT) .................... 102016000084790

(51) Int. Cl.
*G11C 13/00* (2006.01)
*G11C 17/18* (2006.01)

(52) U.S. Cl.
CPC ........ *G11C 13/004* (2013.01); *G11C 13/0004* (2013.01); *G11C 13/0026* (2013.01); *G11C 13/0064* (2013.01); *G11C 13/0069* (2013.01); *G11C 17/18* (2013.01); *G11C 2013/0042* (2013.01)

(58) Field of Classification Search
CPC .............. G11C 13/004; G11C 13/0004; G11C 13/0069; G11C 13/0026; G11C 13/0064
USPC ........................... 365/163, 158, 207, 189.07
See application file for complete search history.

(56) References Cited

U.S. PATENT DOCUMENTS

| | | | |
|---|---|---|---|
| 7,940,553 B2 | 5/2011 | Wu et al. | |
| 8,750,047 B2 | 6/2014 | Perroni et al. | |
| 8,982,615 B2 | 3/2015 | Conte et al. | |
| 9,865,346 B1 * | 1/2018 | Perroni | G11C 13/004 |
| 2002/0085423 A1 | 7/2002 | Tedrow et al. | |
| 2003/0043623 A1 | 3/2003 | Shimbayashi et al. | |
| 2007/0133268 A1 | 6/2007 | Choi et al. | |
| 2009/0273961 A1 | 11/2009 | Ono et al. | |

(Continued)

*Primary Examiner* — David Lam
(74) *Attorney, Agent, or Firm* — Slater Matsil, LLP

(57) ABSTRACT

A phase change memory device includes two portions with local bitlines connected to memory cells. A reading stage is configured to read logic data stored by the first and second memory cells. A first main bitline extends between the reading stage and the first local bitlines and a first main switch is coupled between the first main bitline and reading stage and likewise for the second portion. Local switches are associated with respective ones of the local bitlines. A first reference signal generator is coupled to the reading stage. The phase change memory device is configured to operate in a first reading mode, in which the logic data stored by the first memory cell is read by the reading stage by comparison with the reference signal.

20 Claims, 4 Drawing Sheets

(56) References Cited

U.S. PATENT DOCUMENTS

| | | | |
|---|---|---|---|
| 2010/0290280 A1* | 11/2010 | Seo | G11C 7/062 |
| | | | 365/171 |
| 2011/0199812 A1* | 8/2011 | Kitagawa | G11C 7/1048 |
| | | | 365/148 |
| 2012/0155146 A1* | 6/2012 | Ueda | G11C 11/1659 |
| | | | 365/148 |
| 2013/0301348 A1 | 11/2013 | Perroni et al. | |
| 2015/0243356 A1 | 8/2015 | Conte et al. | |
| 2016/0211036 A1 | 7/2016 | Takizawa | |

\* cited by examiner

PHASE CHANGE MEMORY DEVICE AND METHOD OF OPERATION

CROSS-REFERENCE TO RELATED APPLICATIONS

This application is a continuation of U.S. patent application Ser. No. 15/475,609, filed Mar. 31, 2017, which claims priority to Italian Patent Application No. 102016000084790, filed on Aug. 11, 2016, both applications are hereby incorporated herein by reference.

TECHNICAL FIELD

The present invention relates to a phase change memory device, to a system including the phase change memory device and to an operating method of the phase change memory device.

BACKGROUND

Non-volatile phase change memories (PCMs) are known, which exploit, for storing information, the characteristics of materials that have the property of switching between phases that present different electrical characteristics. For instance, the materials may switch between an amorphous phase, which is disorderly and a crystalline or polycrystalline phase, which is orderly and the two phases are associated to resistivities of a considerably different value and consequently to a different value of a datum stored. For instance, the elements of Group VI of the periodic table, such as tellurium (Te), selenium (Se), or antimony (Sb), called chalcogenides or chalcogenic materials, may advantageously be used for producing phase change memory cells.

Phase changes are obtained by locally increasing the temperature of the cells of chalcogenic material, through resistive electrodes (generally known as heaters) arranged in contact with respective regions of chalcogenic material. Selection devices (for example, MOSFETs), are connected to the heaters and enable passage of an electric programming current through a respective heater. The electric current, by the Joule effect, generates the temperatures necessary for phase change. During reading, the state of the chalcogenic material is detected by applying a voltage sufficiently low as not to cause a sensible heating and then by reading the value of the current that flows in the cell. Given that the current is proportional to the conductivity of the chalcogenic material, it is possible to determine what state the material is in and thus trace back to the datum stored in the memory cell.

In a known way, non-volatile memories comprise an array of memory cells arranged in rows (wordlines) and columns (bitlines). Each memory cell is formed, in the case of PCMs, by a phase change memory element of and by a selection transistor, connected in series. A column decoder and a row decoder enable selection, on the basis of logic address signals received at input and more or less complex decoding schemes, of the memory cells and in particular the corresponding wordlines and bitlines, each time addressed.

The column decoder comprises a plurality of analog selection switches (formed by transistors), which receive the address signals on the respective control terminals. The selection switches are arranged according to a tree structure in hierarchical levels and their number in each hierarchical level is linked to the organization and to the size of the memory array. Once enabled, the selection switches enable the bitline selected to be brought to a defined value of voltage and/or current, according to the operations that are to be implemented. In particular, a current path is created between a programming stage or a reading stage and the bitline selected. The current path is defined by the series of a certain number of selection switches.

In a known way, sense amplifiers carry out reading of the data stored in the memory cells by comparing the current that flows in the memory cell selected (or an electrical quantity correlated thereto) with a reference current that flows in a reference cell (the so-called "double-ended reading"), or else with a reference current supplied by a reference-current generator (the so-called "single-ended reading"). Single-ended reading is typically used when verifying that programming of the cell has gone through or during testing, whereas double-ended reading is typically used during normal use of the memory, for reading the logic datum stored in the cell that is to be read.

To carry out single-ended reading, an input of the sense amplifier receives the current of the memory cell that is to be read, whereas the other input of the sense amplifier receives the reference current supplied by the reference-current generator.

In both of the modes referred to, it is expedient to guarantee, as far as possible, similar working conditions for the sense amplifier, paying particular attention to the capacitive load on the two inputs thereof. This need, however, is hard to be found in single-ended reading systems in so far as, in a per se known manner, the capacitance associated to a reference-current generator used in single-ended reading is different from the capacitance that derives from the bitlines used to carry the current signal of the cell that is to be read.

Furthermore, it may be noted that the effective value of capacitance associated to the bitlines is affected by a series of unforeseeable factors, such as the manufacturing process spread. Consequently, fluctuations may occur that do not render convenient the use of a pre-set capacitance associated to the reference-current generator.

SUMMARY

Embodiments of the present invention provide a PCM device that will enable the problems associated to the decoders of a known type to be solved totally or in part and that will be optimized as regards the characteristics of capacitive load seen by the sense amplifier in both the single-ended reading mode and in the double-ended reading mode. Embodiments of the present invention also teach an operating method of the PCM memory device.

According to the present invention, a phase change memory device, a system including the phase change memory device and an operating method of the phase change memory device are consequently provided.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF ILLUSTRATIVE EMBODIMENTS

As will be described in detail in what follows, an aspect of the present disclosure envisages splitting the column decoder into two portions that may be controlled independently of one another and configuring the driving signals of the two portions of the column decoder to guarantee a comparable capacitive load on the two inputs of the sense amplifier in both the single-ended reading operation (reading of a logic datum stored in a memory cell by comparison with a current reference) and the double-ended reading operation (reading of a logic datum stored in a memory cell through comparison with a further memory cell). Single-ended reading is typically used during verification of data previously written in the memory.

In particular, in the case of single-ended reading of a memory cell selected via the corresponding wordline and coupled to a local bitline of a memory sector, the sense amplifier will have, on a first input thereof, the capacitance associated to the local bitline plus the capacitance associated to a first main bitline to which the local bitline is connected. Furthermore, the sense amplifier will receive, on a second input thereof, the reference current used for the comparison but also a capacitance associated to a further main bitline that, during this operation, is decoupled from local bitlines. In other words, the sense amplifier receives on both of the inputs a capacitive load of a similar amount.

Since, the value of capacitance of the main bitlines of a PCM is up to 10 times that of the local bitlines, the capacitive contribution of the latter may be neglected (e.g., 40 fF for the local bitline and 400 fF for the main bitline).

Figure 1:
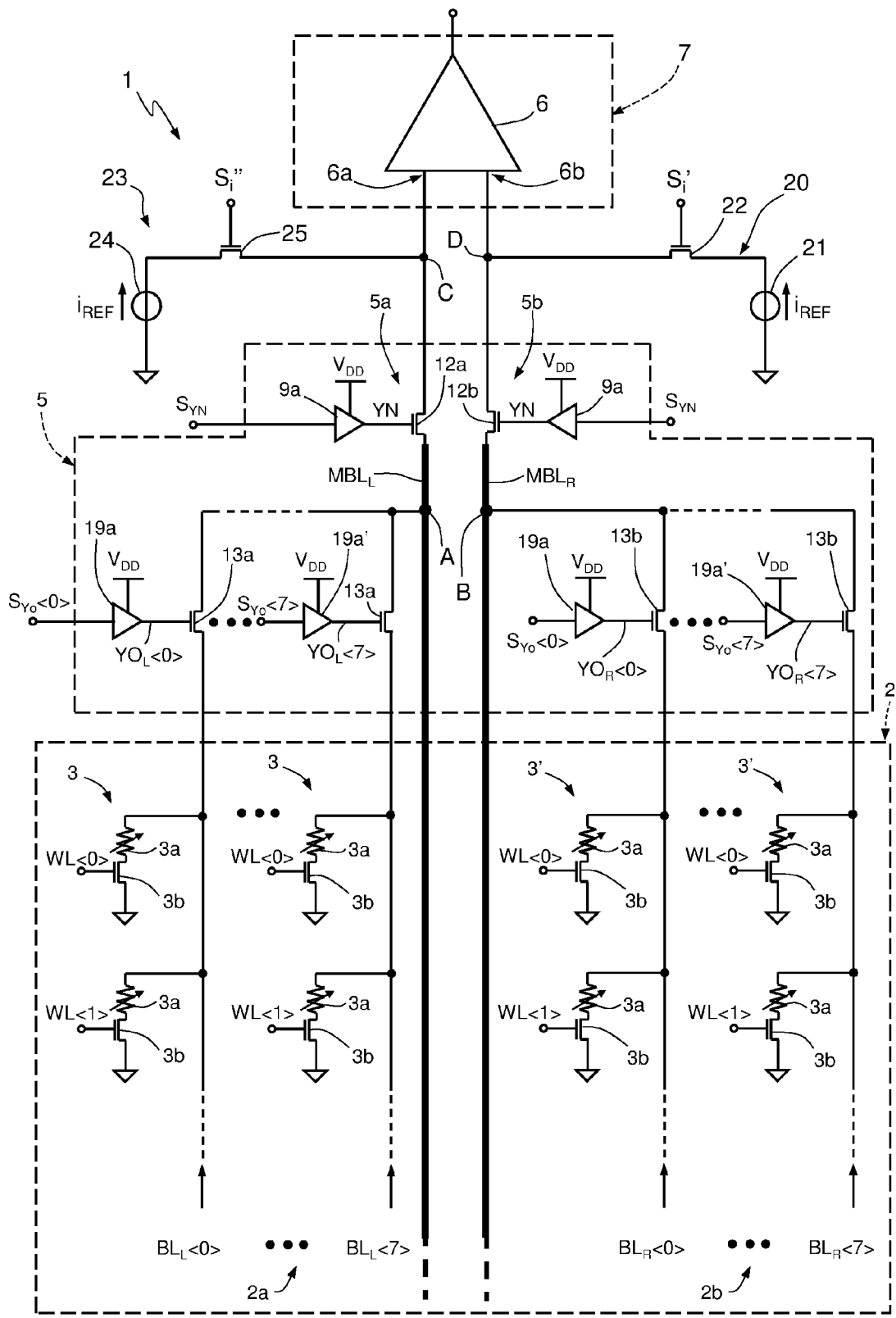
FIGS. 1 and 4 show schematic circuit diagrams of a portion of a non-volatile memory device, in particular of a PCM type and of a corresponding column decoder, according to embodiments of the present invention.

Illustrated schematically in FIG. 1 and designated as a whole by the reference number 1 is a portion of a non-volatile memory device, in particular of a PCM type, limitedly to just the parts necessary for an understanding of the present disclosure.

In particular, the non-volatile memory device 1 comprises a memory array 2, constituted by a plurality of first memory cells 3 and by a plurality of second memory cells 3', which may be selected by local wordlines WL and local bitlines BL. In a per se known manner, the second memory cells 3' correspond, as regards number and characteristics of production, to the first memory cells 3 and, in use, store the same logic datum as the first memory cells 3 (they represent, in fact, a physical and logical copy of the first memory cells 3). The second memory cells 3' are queried during double-ended reading of the first memory cells 3, for reading the logic datum stored in the first memory cells 3 through comparison with the logic datum stored in respective second memory cells 3'.

Illustrated in FIG. 1 are first memory cells 3, operatively coupled to respective local wordlines WL, designated by WL<0> and WL<1> and to respective local bitlines $BL_L$, here eight in number and designated by $BL_L<0>, \ldots, BL_L<7>$. Likewise shown are second memory cells 3', operatively coupled to the local wordlines WL<0> and WL<1> and to respective local bitlines $BL_R$, here eight in number and designated by $BL_R<0>, \ldots, BL_R<7>$.

The local bitlines $BL_L<0>, \ldots, BL_L<7>$ and the first memory cells 3 form a first memory portion 2a. The local bitlines $BL_R<0>, \ldots, BL_R<7>$ and the second memory cells 3' form a second memory portion 2b.

The first and second memory cells 3, 3' are identical to one another and comprise a phase change element 3a and a selector element 3b, operatively coupled thereto. The phase change element 3a includes a phase change material (for example, a chalcogenide) and is thus able to store data in the form of levels of resistance associated to the different phases assumed by the phase change material (in FIG. 1, the phase change element 3a is represented as a resistor with variable resistance). The selector element 3b, in the embodiment illustrated, is an NMOS transistor having its gate terminal connected to the respective wordline WL, a first conduction terminal connected to the phase change element 3a and a second conduction terminal connected to a reference potential (for example, ground). The selector element 3b is controlled for enabling, when selected (i.e., turned on by the signal of the respective local wordline WL to which it is coupled), passage of a reading current through the phase change element 3a during an operation of reading of the logic datum stored therein.

The non-volatile memory device 1 further comprises a row decoder (not illustrated herein), designed to select the local wordline WL corresponding to the memory cell 3, 3' each time to be addressed and a column decoder 5, designed to select the bitline of the memory cell 3, 3' to be addressed. Given the matrix structure, activation of a local wordline WL and of a local bitline BL enables unique selection of one and only one memory cell 3, 3'. The column decoder 5 is arranged between the memory array 2 and a reading stage 7, of a per se known type and provided with a sense amplifier 6. A programming stage for the first and second memory cells 3, 3', which is also per se known and provided with programming driver, is present but not illustrated in so far as it does not form the subject of the present disclosure.

In particular, during use, the column decoder 5 receives at input address selection signals (also known as "decoded address signals", or DAS) $S_{YO}<0>, \ldots, S_{YO}<7>$ for selecting a respective local bitline $BL_L<0>, \ldots, BL_L<7>$ and/or $BL_R<0>, \ldots, BL_R<7>$ in order to access the first and/or second memory cells 3, 3'. The modality of selection of the local bitlines $BL_L<7:0>$ and $BL_R<7:0>$ is more fully illustrated in what follows with reference to FIG. 2. The signals $S_{YO}<7:0>$ are low-voltage signals, which operate that is, in the range of logic voltages [GND, VDD], where VDD is, for example, comprised between 1 V and 1.4 V and GND is a reference ground voltage, for example, 0 V.

In greater detail, the column decoder 5 is configured to generate a current path between a bitline selected from $BL_L<0>, \ldots, BL_L<7>$ and a first input 6a of the sense amplifier 6 and between a bitline selected from $BL_R<0>, \ldots, BL_R<7>$ and a second input 6b of the sense amplifier 6.

A first main bitline $MBL_L$ extends between the first input 6a of the sense amplifier 6 and a node A common to all the local bitlines $BL_L<0>, \ldots, BL_L<7>$, through interposition of a main selection switch 12a. A second main bitline $MBL_R$ extends between the second input 6b of the sense amplifier 6 and a node B common to all the local bitlines $BL_R<0>, \ldots, BL_R<7>$, through interposition of a respective main selection switch 12b.

Each local bitline $BL_L<0>, \ldots, BL_L<7>$ of the first memory portion 2a is electrically coupled to the node A by a respective local selection switch 13a (in the example of FIG. 1 local selection switches 13a are present in the form of NMOS transistors). Likewise, each local bitline $BL_R<0>, \ldots, BL_R<7>$ of the second memory portion 2b is electrically coupled to the node B by a respective local selection switch 13b (in this example, NMOS transistors).

According to one aspect of the present disclosure, the column decoder 5 thus comprises two distinct read-decoding circuits and in particular a first read-decoding block 5a and a second read-decoding block 5b, designed to generate a respective current path between a first memory cell 3 selected and the first input 6a of the sense amplifier and, respectively, between a second memory cell 3' selected and the second input 6b of the sense amplifier 6. The current paths thus generated are completely distinct and separate from one another.

The first read-decoding block 5a and the second read-decoding block 5b have a specular circuit structure. The number of selection switches that form the column decoder 5 depends upon the size of the memory array 2 and/or of the sectors of the memory array 2 and upon the hierarchical organization of the column selectors.

The first and second read-decoding blocks 5a, 5b further comprise main buffers 9a that drive the main selection switches 12a, 12b. For simplicity of representation, FIG. 1 illustrates two main buffers 9a coupled to the respective selection switches 12a, 12b. However, since driving of the selection switches 12a, 12b is common to both, it is possible to use a common main buffer 9a the output of which is connected to the selection switches 12a, 12b. It is consequently assumed, in the sequel of the description, that a single main buffer 9a is present that drives both of the selection switches 12a, 12b. The main buffer 9a receives the signal $S_{YN}$ and supplies to the control terminals of the respective selection switches 12a, 12b a column-decoding signal YN.

The first and second read-decoding blocks 5a, 5b further comprise a respective plurality of local buffers 19a, 19a'. Bitlines belonging to the first portion 2a and corresponding to respective bitlines of the second portion 2b of the memory array 2 (i.e., the bitlines selected by a same signal $S_{YO}<7:0>$) may share a same local buffer 19a, 19a'. In this case, the local buffers are in number equal to one half of the sum of the local selection switches 13a and 13b and are configured to receive a respective signal from among $S_{YO}<0>, \ldots, S_{YO}<7>$ and supply to the control terminals of the respective local selection switches 13a, 13b column-decoding signals $YO_L<0>, \ldots, YO_L<7>, YO_R<0>, \ldots, YO_R<7>$. In greater detail, the local buffer 19a that receives at input the signal $S_{YO}<0>$ generates at output both of the signals $YO_L<0>$ and $YO_R<0>$ that drive two respective switches 13a, 13b associated to the bitlines $BL_L<0>$ and $BL_R<0>$ belonging to the respective portions 2a, 2b of the memory array 2; likewise, the local buffer that receives at input the signal $S_{YO}<1>$ generates at output the signals $YO_L<1>$ and $YO_R<1>$ that drive the two respective switches 13a, 13b associated to the bitlines $BL_L<1>$ and $BL_R<1>$; and so forth until finally the local buffer 19a' that receives at input the signal $S_{YO}<7>$ generates at output the signals $YO_L<7>$ and $YO_R<7>$ that drive the two respective switches 13a, 13b associated to the bitlines $BL_L<7>$ and $BL_R<7>$.

According to an aspect of the present disclosure, the column-decoding signals $YO_L<0>, \ldots, YO_L<7>$ may have a value different from that of the column-decoding signals $YO_R<0>, \ldots, YO_R<7>$, as a result of operations carried out by the local buffers 19a, 19a', as illustrated more fully hereinafter. In this way, starting from a same signal $S_{YO}<7:0>$ received at input by the column decoder 5, it is possible to generate two command signals $YO_L<7:0>$ and $YO_R<7:0>$ independent of one another, for governing in an independent way respective selection switches 13a, 13b and thus rendering the first and second memory portions 2a, 2b controllable in a separate way independently of one another.

Figure 4:
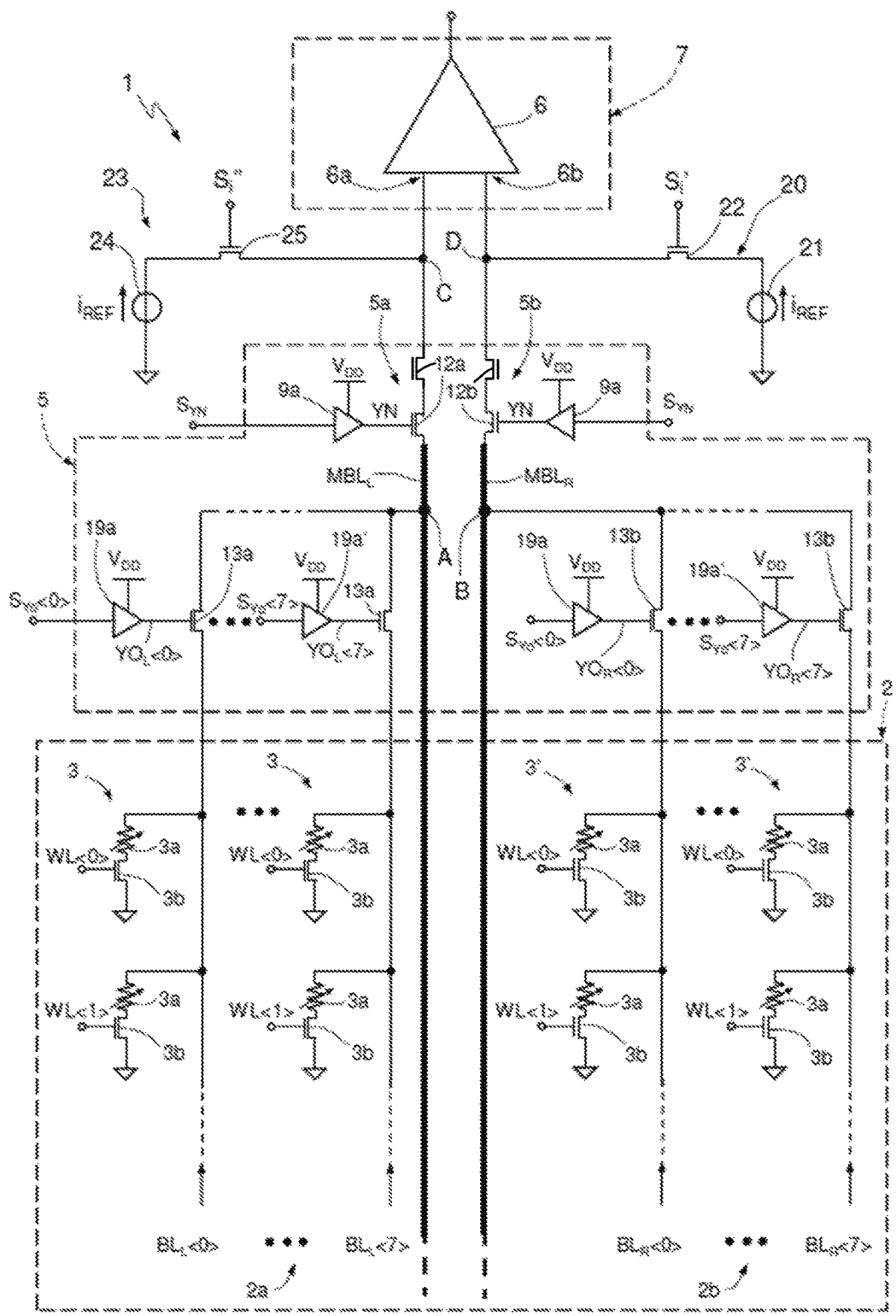

Even though in FIG. 1 a first read-decoding block 5a and a second read-decoding block 5b including just two main selection switches 12a, 12b are illustrated, it is evident that, in a known way, there may be present a plurality of main switches 12a, 12b connected between a node C and respective further main bitlines belonging to the first memory portion 2a and between a node D and respective further main bitlines belonging to the second memory portion 2b (each further main bitline being, in turn, coupled to a respective plurality of local bitlines) as illustrated with reference to FIG. 4.

The selection switches 12a, 12b, 13a, 13b are implemented by NMOS transistors, which have a control terminal (gate) that receives the respective column-decoding signal YN, $YO_L<7:0>$, $YO_R<7:0>$, which is a logic signal having a voltage value in the range from 0 V to 3.6 V (where the value 0 V corresponds to the low logic signal "0" that turns off the respective transistor and the value 3.6 V corresponds to the high logic signal "1" that turns on the respective transistor). In use, the signals $S_{YO}<0>, \ldots, S_{YO}<7>$ and $S_{YN}$ are, as has been indicated, low-voltage signals and one of the operations carried out by the main buffers 9a and local buffers 19a, 19a' is that of raising the voltage to generate a voltage signal adequate for driving the respective NMOS transistor.

The non-volatile memory device 1 further comprises a first reference branch 20 including a reference generator 21, configured to generate a reference current $i_{REF}$, electrically coupled to the second input 6b of the sense amplifier 6 by a selection switch 22. The selection switch 22 is driven by a signal $S_i'$, configured to turn on and turn off the selection switch 22 in respective operating modes of the non-volatile memory device 1, in order to set up or interrupt an electrical path for the reference current $i_{REF}$ towards the second input 6b of the sense amplifier 6.

The non-volatile memory device 1 further comprises a second reference branch 23 including a reference generator 24, configured to generate a reference current $i_{REF}$, electrically coupled to the first input 6a of the sense amplifier 6 by a selection switch 25. The selection switch 25 is driven by a signal $S_i''$, configured to turn on and turn off the selection switch 25 in respective operating modes of the non-volatile memory device 1 in order to set up or interrupt an electrical path for the reference current $i_{REF}$ towards the first input 6a of the sense amplifier 6.

Figure 2:
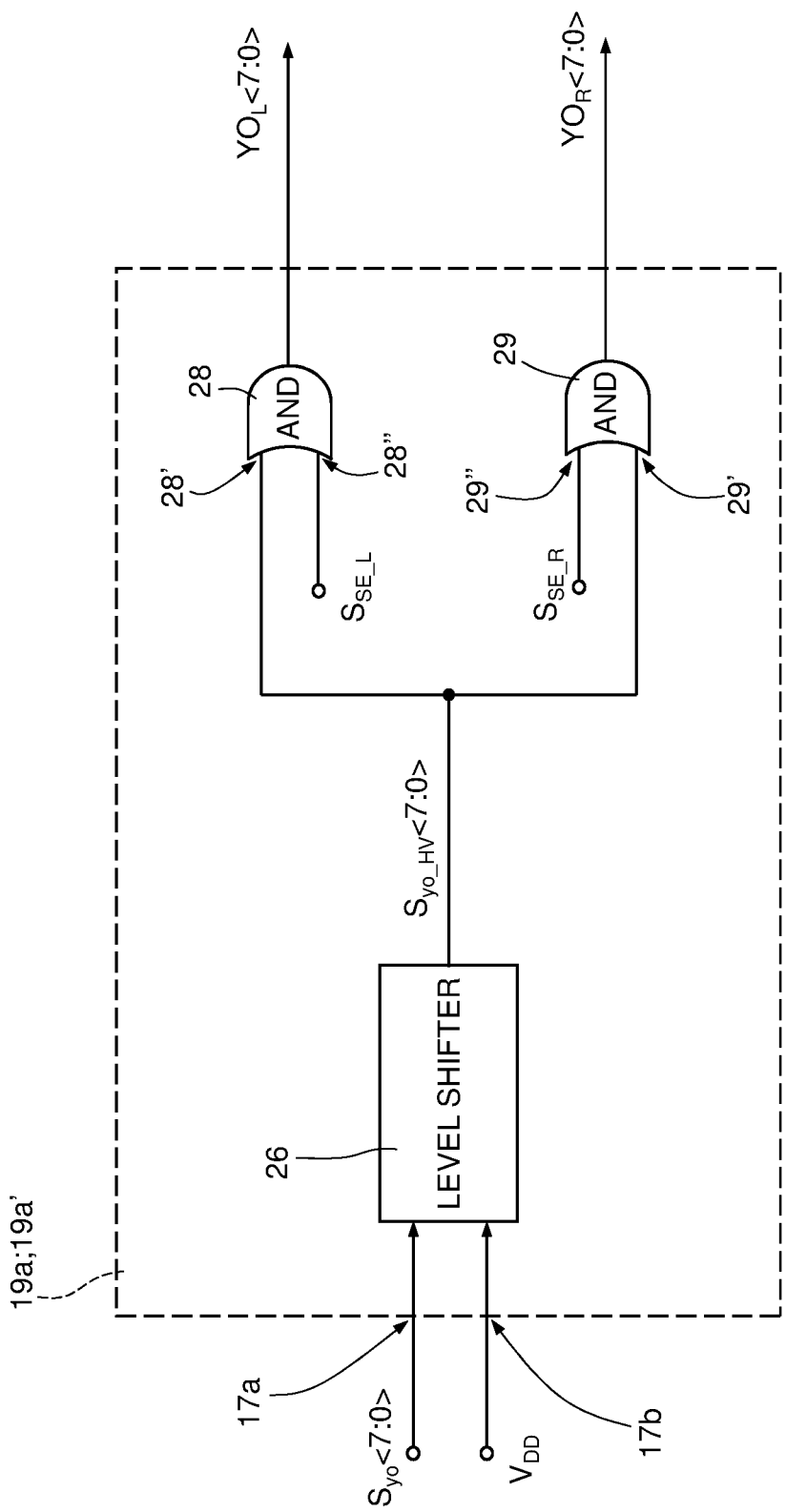
FIG. 2 shows in greater detail a driving buffer that forms part of the column decoder of FIG. 1.

FIG. 2 shows an embodiment of the local buffer 19a or the local buffer 19a' (which are identical as regards their physical implementation). Each local buffer 19a, 19a' has two inputs 17a, 17b, which receive, respectively, one of the signals $S_{YO}<0>, \ldots, S_{YO}<7>$ and the voltage VDD comprised between 1 V and 1.4 V. These two inputs are, in particular, the inputs of a level shifter 26, configured to generate at output an intermediate signal $S_{YO\_HV}<0>, \ldots, S_{YO\_HV}<7>$ by raising the voltage value of the signal $S_{YO}<0>, \ldots, S_{YO}<7>$. The intermediate signal $S_{YO\_HV}<0>, \ldots, S_{YO\_HV}<7>$ has a value comprised between 0 V and 3.6 V.

The local buffer 19a, 19a' has further a first logic gate 28 and a second logic gate 29, each configured to carry out an AND logic operation. The first logic gate 28 receives on a first input 28' the intermediate signal $S_{YO\_HV}<0>, \ldots, S_{YO\_HV}<7>$ and on a second input 28" a signal $S_{SE\_L}$. The signal $S_{SE\_L}$ is a logic signal the value of which, high "1" (e.g., 3.6 V) or low "0" (e.g., 0 V), indicates an operating condition of the non-volatile memory device 1 between single-ended reading and double-ended reading.

The second logic gate 29 receives on a first input 29' the intermediate signal $S_{YO\_HV}<0>, \ldots, S_{YO\_HV}<7>$ and on a second input 29" a signal $S_{SE\_R}$. The signal $S_{SE\_R}$ is a logic signal the value of which, high "1" or low "0", indicates an operating condition of the non-volatile memory device 1 between single-ended reading and double-ended reading.

For instance, for double-ended reading operations of the memory cell 3 addressed by the bitline $BL_L<0>$, the signal $S_{YO}0<0>$ assumes a value of 1V. The remaining signals $S_{YO}<7:1>$ assume a value of 0 V.

The level shifter 26 raises the value of the signal $S_{YO}<0>$ from the value 1V to the value 3.6 V, thus generating the signal $S_{YO\_HV}<0>$ (high logic value "1").

Since, in the double-ended reading mode, it is desired to carry out a comparative reading of two corresponding memory cells 3, 3', both of the signals $S_{SE\_L}$ and $S_{SE\_R}$ are generated with a high logic value "1", so that both of the signals $YO_L<0>$ and $YO_R<0>$ at output from the logic gates 28, 29 have a high logic value "1", in particular 3.6 V. As described with reference to FIG. 1, such a signal $YO_L<0>$ turns on the respective transistor 13a, electrically coupling the memory cell 3 selected to the node A. Likewise, the signal $YO_R<0>$ turns on the respective transistor 13b, electrically coupling the memory cell 3' selected to the node B.

In this operating condition, the signal YN is such as to drive into the on state both of the transistors 12a and 12b. The memory cells 3, 3' selected are thus electrically connected to the input 6a and to the input 6b, respectively, of the sense amplifier 6, which thus may carry out a double-ended reading in a per se known manner that does not form the subject of the present disclosure.

What is described applies, in a similar way, for reading of any other memory cell 3.

As regards, instead, a single-ended reading of the memory cell 3 addressed by the bitline $BL_L<0>$, the signal $S_{YO}<0>$ assumes a value of 1 V. The remaining signals $S_{YO}<7:1>$ assume a value of 0 V.

Operation of the level shifter 26 is that of raising the signal $S_{YO}<0>$ to the value 3.6 V, thus generating the signal $S_{YO\_HV}<0>$ with high logic value "1".

Since in single-ended reading it is desired to carry out a reading of the memory cell 3 comparing it with the reference current $i_{REF}$, the signal $S_{SE\_L}$ is generated with a high logic value "1", whereas the signal $S_{SE\_R}$ is generated with a low logic value "0", so that only the signal $YO_L<0>$ at output from the logic gate 28 has a high logic value "1", in particular 3.6 V. Instead, the signal $YO_R<0>$ at output from the logic gate 29 has a low logic value "0", in particular 0 V. As described with reference to FIG. 1, the signal $YO_L<0>$ turns on the respective transistor 13a, electrically coupling the memory cell 3 selected to the node A. Instead, the signal $YO_R<0>$ is not able to turn on the respective transistor 13b, thus keeping the memory cells 3' of the local bitline $BL_R<0>$ decoupled from the node B.

In this operating condition, the signal YN is generated with a value such as to drive into the on state both of the transistors 12a and 12b. The memory cell 3 selected is thus electrically connected to the input 6a of the sense amplifier 6.

Furthermore, during single-ended reading, the signal $S_i'$ assumes a value such as to turn on the selection switch 22, electrically coupling the reference-current generator 21 to the second input 6b of the sense amplifier 6.

The sense amplifier 6 may thus carry out a reading of a "single-ended" type in a per se known manner that does not form the subject of the present disclosure.

What has been described applies, in a similar way, to single-ended reading of any other memory cell 3. What has been described likewise applies, in a similar way, to verification by single-ended reading of the memory cells 3', using as current reference the current $i_{REF}$ generated by the current generator 24 and supplied to the input 6a of the sense amplifier 6.

It may be noted that, during single-ended reading of the first memory portion 2a, the selection switches 13b are off, whereas the selection switch 12b is on. It may likewise be noted that, during single-ended reading of the second memory portion 2b, the selection switches 13a are off, whereas the selection switch 12a is on.

In this way, both of the main bitlines $MBL_L$ and $MBL_R$ are capacitively coupled to the respective first and second inputs 6a, 6b of the sense amplifier 6. Since the most important capacitive component, in PCMs, is represented precisely by the main bitline (which is typically provided in the form of metal conductive path typically with a length of 2 mm and a width of 1 µm), a similar, or comparable, capacitive load is in this way guaranteed on both of the inputs 6a, 6b of the sense amplifier 6.

Furthermore, the contributions of the parasitic capacitances due to the transistors 12a, 12b affect the inputs 6a, 6b of the sense amplifier 6 to the same extent, thus reducing the negative effects that different values of capacitance applied to the inputs 6a, 6b may have on the reading operations.

Figure 3:
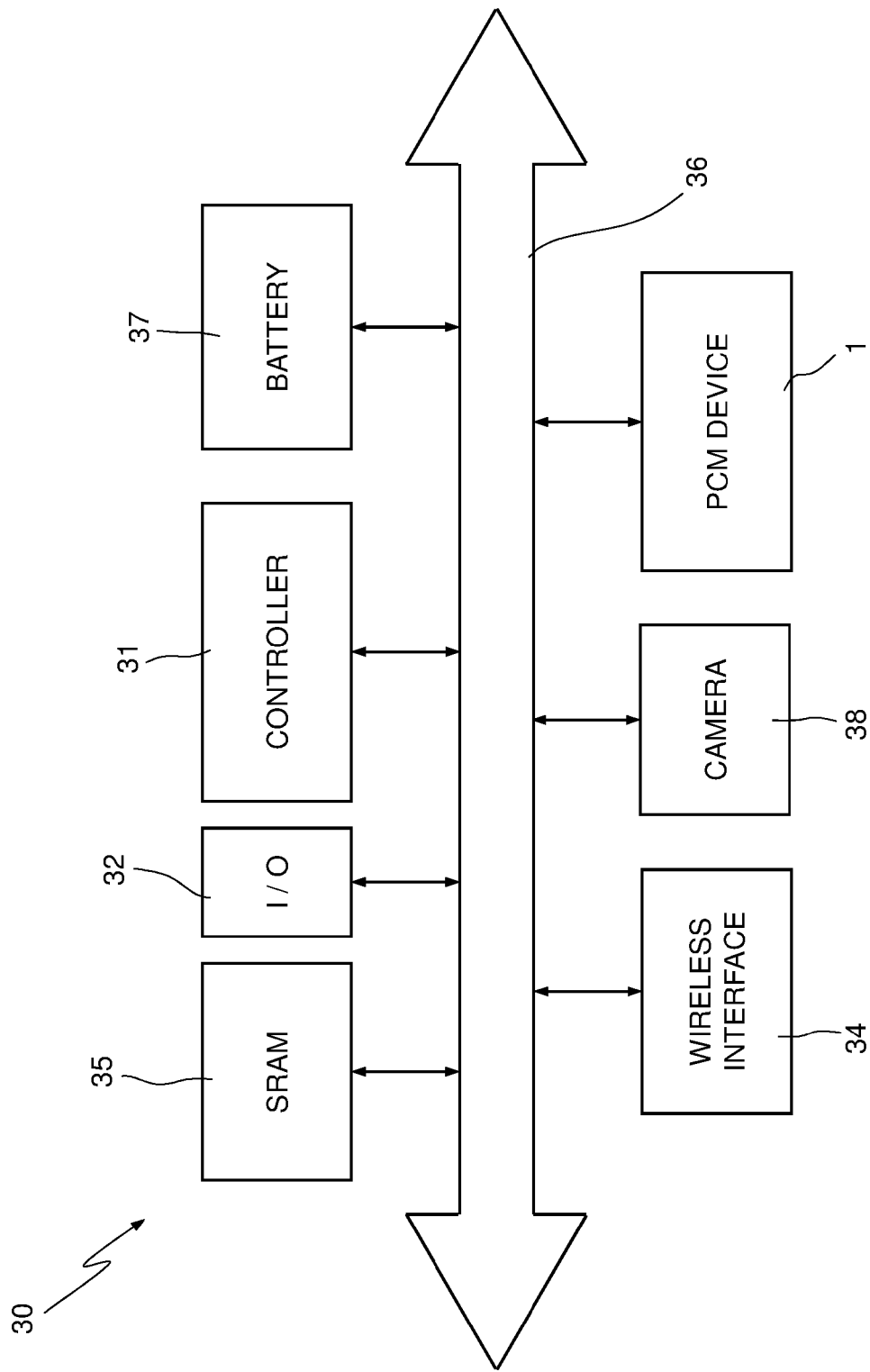
FIG. 3 is a simplified block diagram of an electronic system incorporating the non-volatile memory device, in one embodiment of the present invention.

FIG. 3 illustrates a portion of an electronic system 30, according to a further embodiment of the present invention. The electronic system 30 may be used in electronic devices, such as: a PDA (Personal Digital Assistant); a portable or fixed computer, possibly with wireless data-transfer capacity; a cellphone; a digital audio player; a photographic camera or video camera; or further devices that are able to process, store, transmit and receive information.

In detail, the electronic system 30 comprises a controller 31 (for example, provided with a microprocessor, a DSP, or a microcontroller), an input/output device 32 (for example, provided with a keypad and a display), for entering and displaying data, the non-volatile memory device 1, provided with the array of memory cells of the phase change type described previously, a wireless interface 34, for example, an antenna, for transmitting and receiving data through a radiofrequency wireless communication network and a RAM 35, all coupled through a bus 36. A battery 37 may be used as electric power supply source in the electronic system 30, which may further be provided with a photographic or video camera 38.

From what has been described and illustrated previously, the advantages that the column decoder according to the invention affords are evident.

In any case, it is again emphasized how the separation of the current paths in column decoding enables independent and optimized sizing and design of the corresponding command signals for the selection switches, thus enabling improved performance during reading to be obtained.

The architecture proposed enables reduction of the errors during reading, further improving the times of access to the memory.

Finally, it is clear that modifications and variations may be made to what has been described and illustrated herein, without thereby departing from the scope of the present invention, as defined in the annexed claims.

In particular, the column decoder described and illustrated may be advantageously applied also in other types of memory devices, for example, in flash memory devices.

It is evident that there may be provided a different number of selection switches in the column decoder and a different organization thereof in hierarchical levels. For instance, there may be present a plurality of selection switches 12a, 12b, each coupled to respective eight selection switches 13a according to a tree structure.

Furthermore, with reference to the buffers 19a, 19a' of FIG. 2, the level shifter 26 may be omitted in the case where the signal $S_{YO}$<7:0> has a logic value compatible with the AND logic gates 28 and 29.

As discussed above, the column decoder of a PCM memory device can be divided into two portions that may be controlled independently of one another and the driving signals of the two portions are configured to guarantee a comparable capacitive load on the two inputs of a sense amplifier in both the single-ended reading operations (used, for example, during verification of data previously written in the memory) and the double-ended reading operations (reading proper of the data during use). In particular embodiments, during single-ended reading, the sense amplifier has a first input coupled both to the capacitance associated to the local bitline of a memory sector selected and to the capacitance associated to the main bitline of the memory sector and a second input, which receives a reference current, is likewise coupled to the capacitance associated to a further main bitline.

What is claimed is:

1. A memory device comprising:
   a sense amplifier having a first input and a second input;
   a first main bit line coupled to the first input of the sense amplifier;
   a second main bit line coupled to the second input of the sense amplifier;
   a first reference current generator coupled to the first input of the sense amplifier;
   a second reference current generator coupled to the second input of the sense amplifier;
   a first switch coupled between the first input of the sense amplifier and the first reference current generator;
   a second switch coupled between the second input of the sense amplifier and the second reference current generator;
   a memory array arranged in rows and columns, the memory array comprising
      a first portion comprising N local bit lines, N being a positive integer greater than zero, wherein each of the N local bit lines of the first portion of the memory array is connected to respective pluralities of phase change memory cells, and
      a second portion comprising N local bit lines, wherein each of the N local bit lines of the second portion of the memory array is connected to respective pluralities of phase change memory cells; and
   a column decoder comprising
      a third switch coupled between the first input of the sense amplifier and the first main bit line,
      a fourth switch coupled between the second input of the sense amplifier and the second main bit line,
      N first local switches coupled between respective local bit lines of the N local bit lines of the first portion of the memory array and the first main bit line, and
      N second local switches coupled between respective local bit lines of the N local bit lines of the second portion of the memory array and the second main bit line.

2. The memory device of claim 1, wherein
   the first main bit line has a first capacitance; and
   each of the N local bit lines of the first portion of the memory array has a second capacitance up to 10 times smaller than the first capacitance.

3. The memory device of claim 1, wherein N is equal to 8.

4. The memory device of claim 1, wherein the first, second, third and fourth switches are NMOS transistors.

5. The memory device of claim 1, wherein the column decoder further comprises a main buffer having an output coupled to a control node of the third switch.

6. The memory device of claim 5, wherein the output of the main buffer is further coupled to a control node of the fourth switch.

7. The memory device of claim 1, wherein the column decoder further comprises N local buffers, each of the N local buffers having an output coupled to a control node of a respective switch of the N first local switches.

8. The memory device of claim 7, wherein the output of each of the N local buffers is further coupled to a control node of a respective switch of the N second local switches.

9. The memory device of claim 8, wherein each of the N local buffers comprises:
   a level shifter having a supply input and an output;
   a first AND gate having a first input coupled to the output of the level shifter, a second input configured to receive a first selection signal, and an output coupled to the control node of the respective switch of the N first local switches; and
   a second AND gate having a first input coupled to the output of the level shifter, a second input configured to receive a second selection signal, and an output coupled to the control node of the respective switch of the N second local switches.

10. The memory device of claim 9, wherein supply input of the level shifter is configured to receive a voltage between 1 V and 1.4 V, and the output of the level shifter is configured to have a voltage of 3.6 V when the output of the level shifter is in a high state.

11. The memory device of claim 1, wherein the pluralities of phase change memory cells comprise a phase change material, the phase change material comprising chalcogenide.

12. The memory device of claim 1, wherein the column decoder further comprises:
   one or more switches coupled between the third switch and the first input of the sense amplifier; and
   one or more switches coupled between the fourth switch and the second input of the sense amplifier and the second main bit line.

13. The memory device of claim 1, wherein the first main bit line comprises a metal conductive path having a length of 2 mm and a width of 1 μm.

14. The memory device of claim 1, wherein the memory device is configured to, in a first mode of operation,
   turn off the first and second switches,
   turn on the third and fourth switches, and
   control the N first local switches and the N second local switches based on a decoded address signal received by the column decoder.

15. The memory device of claim 1, wherein the memory device is configured to,
   in a second mode of operation,
      turn off the first switch,
      turn on the second switch,
      turn on the third and fourth switches,
      turn off all the N second local switches, and
      control the N first local switches based on a decoded address signal received by the column decoder; and
   in a third mode of operation,
      turn on the first switch,
      turn off the second switch,
      turn on the third and fourth switches, turn off all the N first local switches, and
control the N second local switches based on the decoded address signal.

16. A method comprising:
receiving a decoded address signal with a column decoder of a memory device, the memory device comprising a memory array arranged in rows and columns, the memory array comprising
   a first portion having N local bit lines, N being a positive integer greater than zero, wherein each of the N local bit lines of the first portion of the memory array is connected to respective pluralities of phase change memory cells, and
   a second portion having N local bit lines, wherein each of the N local bit lines of the second portion of the memory array is connected to respective pluralities of phase change memory cells, the column decoder comprising
      a first switch coupled between a first main bit line and a first input of a sense amplifier, the first input of the sense amplifier further coupled to a first reference current generator via a second switch,
      a third switch coupled between a second main bit line and a second input of the sense amplifier, the second input of the sense amplifier further coupled to a second reference current generator via a fourth switch,
      N first local switches coupled between respective first local bit lines and the first main bit line, and
      N second local switches coupled between respective second local bit lines and the second main bit line;
receiving a first selection signal;
receiving a second selection signal;
turning on the first switch and the third switch;
controlling the N first local switches based on the decoded address signal and the first selection signal; and
controlling the N second local switches based on the decoded address signal and the second selection signal.

17. The method of claim 16, wherein:
when the first selection signal is in a first state, controlling the N first local switches is based on the decoded address signal;
when the first selection signal is in a second state, all of the N first local switches are off;
when the second selection signal is in the first state, controlling the N second local switches is based on the decoded address signal; and
when the second selection signal is in the second state, all of the N second local switches are off.

18. The method of claim 17, further comprising:
in a first mode of operation,
   generating the first selection signal in the first state,
   generating the second selection signal in the first state, and
   turning off the second and fourth switches; and
in a second mode of operation,
   generating the first selection signal in the first state,
   generating the second selection signal in the second state,
   turning off the second switch, and
   turning on the fourth switch.

19. A phase change memory device comprising:
a sense amplifier having a first input and a second input;
a first main bit line coupled to the first input of the sense amplifier;
a second main bit line coupled to the second input of the sense amplifier;
a first reference current generator coupled to the first input of the sense amplifier;
a second reference current generator coupled to the second input of the sense amplifier;
a first transistor coupled between the first input of the sense amplifier and the first reference current generator;
a second transistor coupled between the second input of the sense amplifier and the second reference current generator;
a memory array arranged in rows and columns, the memory array comprising
   a first portion comprising N local bit lines, N being a positive integer greater than zero, wherein each of the N local bit lines of the first portion of the memory array is connected to respective pluralities of phase change memory cells, and
   a second portion comprising N local bit lines, wherein each of the N local bit lines of the second portion of the memory array is connected to respective pluralities of phase change memory cells; and
a column decoder having N inputs configured to receive decoded address signals, the column decoder comprising
   a third transistor coupled between the first input of the sense amplifier and the first main bit line,
   a fourth transistor coupled between the second input of the sense amplifier and the second main bit line,
   N first local transistors coupled between respective local bit lines of the N local bit lines of the first portion of the memory array and the first main bit line,
   N second local transistors coupled between respective local bit lines of the N local bit lines of the second portion of the memory array and the second main bit line, and
   N local buffers, each of the N local buffers having an output coupled to a control node of a respective transistor of the N first local transistors, wherein each of the N local buffers comprises
      a first AND gate having a first input coupled to a respective input of the N inputs of the column decoder, a second input configured to receive a first selection signal, and an output coupled to the control node of the respective transistor of the N first local transistors; and
      a second AND gate having a first input coupled to the respective input of the N inputs of the column decoder, a second input configured to receive a second selection signal, and an output coupled to the control node of the respective transistor of the N second local transistors.

20. The phase change memory device of claim 19, wherein each of the N local buffers further comprises a level shifter coupled between the respective input of the N inputs of the column decoder and the first input of the first AND gate and the first input of the second AND gate.

* * * * *